United States Patent [19]
Tanaka et al.

[11] Patent Number: 5,774,078
[45] Date of Patent: Jun. 30, 1998

[54] SINGLE MERGING BIT DC-SUPPRESSED RUN LENGTH LIMITED CODING

[75] Inventors: Shin-ichi Tanaka, Kyoto; Toshiyuki Shimada, Kobe,; Koichi Hirayama; Hisashi Yamada, both of Yokohama, all of Japan

[73] Assignees: Matsushita Electric Industrial Co., Ltd., Osaka; Kabushiki Kaisha Toshiba, Kanagawa, both of Japan

[21] Appl. No.: 628,167

[22] Filed: Apr. 5, 1996

[30]    Foreign Application Priority Data

Apr. 14, 1995 [JP]  Japan .................................... 7-089728

[51] Int. Cl.[6] ............................................. H03M 5/06
[52] U.S. Cl. ............................................. 341/68; 341/59
[58] Field of Search ................................ 341/58, 59, 68, 341/95, 106

[56]                    References Cited

U.S. PATENT DOCUMENTS

| | | |
|---|---|---|
| 4,323,931 | 4/1982 | Jacoby . |
| 4,501,000 | 2/1985 | Immink et al. . |
| 4,703,494 | 10/1987 | Ozaki et al. . |
| 4,728,929 | 3/1988 | Tanaka . |
| 4,833,471 | 5/1989 | Tokuume et al. .......................... 341/67 |
| 5,151,699 | 9/1992 | Moriyama . |
| 5,155,485 | 10/1992 | Sako et al. ................................ 341/95 |
| 5,276,674 | 1/1994 | Tanaka . |
| 5,333,126 | 7/1994 | Fukuda et al. . |
| 5,365,231 | 11/1994 | Niimura .................................... 341/58 |

FOREIGN PATENT DOCUMENTS

| | | |
|---|---|---|
| 0178813 | 4/1986 | European Pat. Off. . |
| 0193153 | 9/1986 | European Pat. Off. . |
| 0347934 | 12/1989 | European Pat. Off. . |
| 0415853 | 3/1991 | European Pat. Off. . |
| 0511498 | 11/1992 | European Pat. Off. . |
| 0545516 | 6/1993 | European Pat. Off. . |
| 0577402 | 1/1994 | European Pat. Off. . |
| 0597443 | 5/1994 | European Pat. Off. . |
| 0625828 | 11/1994 | European Pat. Off. . |
| 0673029 | 9/1995 | European Pat. Off. . |
| 4304267 | 8/1993 | Germany . |
| 63-56610 | 5/1983 | Japan . |
| 60-106254 | 6/1985 | Japan . |
| 60-114053 | 6/1985 | Japan . |
| 62-281523 | 12/1987 | Japan . |
| 2061575 | 5/1981 | United Kingdom . |

OTHER PUBLICATIONS

A copy of an International Search Report issued in counterpart PCT application PCT/JP96/00879.
Patent Abstracts of Japan, vol. 12, No. 174 (P–612), May 24, 1988.
Patent Abstracts of Japan, vol. 9, No. 270 (E–353), Oct. 26, 1985.
Patent Abstracts of Japan, vol. 9, No. 258 (E–350), Oct. 16, 1985.
A Copy of an International Search Report issued in counterpart PCT application PCT/JP96/00878.
A Copy of an International Search Report issued in counterpart PCT application PCT/JP96/00880.
English Language Abstract of SHO 63–56610.
"Sequence–state Methods for Run–length–limited Coding", by P.A. Franaszek, was published on pp. 376–383 of IBM J. Res. Develop. in Jul., 1970.

*Primary Examiner*—Howard L. Williams
*Attorney, Agent, or Firm*—Greenblum & Bernstein, P.L.C.

[57]                ABSTRACT

The information to be recorded is divided into 8-bit long data words. Each data word is then converted to 14-bit long code word. The code words are sequentially connected with a one-bit merging bit inserted between the code words to define a code bit sequence. The run-length of 0s in the code bit sequence is limited to be between 2 and 11. The one-bit merging bit normally takes a bit value of 0, but is changed to 1 when any one of the $T_{min}$ control or $T_{max}$ control is applied so as to accomplish the run-length limitation. The $T_{min}$ control is applied when the adjacent bits on both sides of the merging bit are 1s. The $T_{max}$ control is applied when trailing P bits of a code word preceding the merging bit and leading Q bits of a code word following the merging bit are all 0s, provided that $P+Q \geq 11$, and in this case, at least either one of the P bits and Q bits has a bit sequence of (00000), and the bit sequence (00000) is changed to (00100).

18 Claims, 12 Drawing Sheets

Fig.2

8/15 CONVERSION TABLE

| DATA WORD | CODE WORD | DATA WORD | CODE WORD | DATA WORD | CODE WORD |
|---|---|---|---|---|---|
| 0 | 000000000100001 | 50 | 000100000000010 | 100 | 001000100010000 |
| 1 | 000000000100010 | 51 | 000100000000100 | 101 | 001000100010001 |
| 2 | 000000000100100 | 52 | 000100000001000 | 102 | 001000100010010 |
| 3 | 000000001000000 | 53 | 000100000001001 | 103 | 001001000000000 |
| 4 | 000000001000001 | 54 | 000100000010000 | 104 | 001001000000001 |
| 5 | 000000001000010 | 55 | 000100000010001 | 105 | 001001000100010 |
| 6 | 000000001000100 | 56 | 000100000010010 | 106 | 001001000000100 |
| 7 | 000000001001000 | 57 | 000100000100000 | 107 | 001001000001000 |
| 8 | 000000001001001 | 58 | 000100000100001 | 108 | 001001000001001 |
| 9 | 000000010000000 | 59 | 000100000100010 | 109 | 001001000010000 |
| 10 | 000000010000001 | 60 | 000100000100100 | 110 | 001001000010001 |
| 11 | 000000010000010 | 61 | 000100001000000 | 111 | 001001000010010 |
| 12 | 000000010000100 | 62 | 000100001000001 | 112 | 001001000100000 |
| 13 | 000000010001000 | 63 | 000100001000010 | 113 | 001001000100001 |
| 14 | 000000010001001 | 64 | 000100001000100 | 114 | 001001000100010 |
| 15 | 000000010010000 | 65 | 000100001001000 | 115 | 001001000100100 |
| 16 | 000000010010001 | 66 | 000100001001001 | 116 | 010000000000010 |
| 17 | 000000010010010 | 67 | 000100010000000 | 117 | 010000000000100 |
| 18 | 000000100000000 | 68 | 000100010000001 | 118 | 010000000001000 |
| 19 | 000000100000001 | 69 | 000100010000010 | 119 | 010000000001001 |
| 20 | 000000100000010 | 70 | 000100010000100 | 120 | 010000000010000 |
| 21 | 000000100000100 | 71 | 000100010001000 | 121 | 010000000010001 |
| 22 | 000000100001000 | 72 | 000100010001001 | 122 | 010000000010010 |
| 23 | 000000100001001 | 73 | 000100010010000 | 123 | 010000000100000 |
| 24 | 000000100010000 | 74 | 000100010010001 | 124 | 010000000100001 |
| 25 | 000000100010001 | 75 | 000100010010010 | 125 | 010000000100010 |
| 26 | 000000100010010 | 76 | 001000000000001 | 126 | 010000000100100 |
| 27 | 000000100100000 | 77 | 001000000000010 | 127 | 010000001000000 |
| 28 | 000000100100001 | 78 | 001000000000100 | 128 | 010000001000001 |
| 29 | 000000100100010 | 79 | 001000000001000 | 129 | 010000001000010 |
| 30 | 000000100100100 | 80 | 001000000001001 | 130 | 010000001000100 |
| 31 | 000010000000001 | 81 | 001000000010000 | 131 | 010000001001000 |
| 32 | 000010000000010 | 82 | 001000000010001 | 132 | 010000001001001 |
| 33 | 000010000000100 | 83 | 001000000010010 | 133 | 010000010000000 |
| 34 | 000010000001000 | 84 | 001000000100000 | 134 | 010000010000001 |
| 35 | 000010000001001 | 85 | 001000000100001 | 135 | 010000010000010 |
| 36 | 000010000010000 | 86 | 001000000100010 | 136 | 010000010000100 |
| 37 | 000010000010001 | 87 | 001000000100100 | 137 | 010000010001000 |
| 38 | 000010000010010 | 88 | 001000001000000 | 138 | 010000010001001 |
| 39 | 000010000100000 | 89 | 001000001000001 | 139 | 010000010010000 |
| 40 | 000010000100001 | 90 | 001000001000010 | 140 | 010000010010001 |
| 41 | 000010000100010 | 91 | 001000001000100 | 141 | 010000010010010 |
| 42 | 000010000100100 | 92 | 001000001001000 | 142 | 010001000000000 |
| 43 | 000010001000000 | 93 | 001000001001001 | 143 | 010001000000001 |
| 44 | 000010001000001 | 94 | 001000010000000 | 144 | 010001000000010 |
| 45 | 000010001000010 | 95 | 001000010000001 | 145 | 010001000000100 |
| 46 | 000010001000100 | 96 | 001000010000010 | 146 | 010001000001000 |
| 47 | 000010001001000 | 97 | 001000010000100 | 147 | 010001000001001 |
| 48 | 000010001001001 | 98 | 001000010001000 | 148 | 010001000010000 |
| 49 | 000100000000001 | 99 | 001000010001001 | 149 | 010001000010001 |

Fig.3

8/15 CONVERSION TABLE

| DATA WORD | CODE WORD | DATA WORD | CODE WORD | DATA WORD | CODE WORD |
|---|---|---|---|---|---|
| 150 | 010001000010010 | 100 | 100001000000010 | 250 | 100100010000100 |
| 151 | 010001000100000 | 201 | 100001000000100 | 251 | 100100010001000 |
| 152 | 010001000100001 | 202 | 100001000001000 | 252 | 100100010001011 |
| 153 | 010001000100010 | 203 | 100001000001001 | 253 | 100100010010000 |
| 154 | 010001000100100 | 204 | 100001000010000 | 254 | 100100010010001 |
| 155 | 010010000000001 | 205 | 100001000010001 | 255 | 100100010010010 |
| 156 | 010010000000010 | 206 | 100001000010010 | | |
| 157 | 010010000000100 | 207 | 100001000100000 | | |
| 158 | 010010000001000 | 208 | 100001000100001 | | |
| 159 | 010010000001001 | 209 | 100001000100010 | | |
| 160 | 010010000010000 | 210 | 100001000100100 | | |
| 161 | 010010000010001 | 211 | 100010000000001 | | |
| 162 | 010010000010010 | 212 | 100010000000010 | | |
| 163 | 010010000100000 | 213 | 100010000000100 | | |
| 164 | 010010000100001 | 214 | 100010000001000 | | |
| 165 | 010010000100010 | 215 | 100010000001001 | | |
| 166 | 010010000100100 | 216 | 100010000010000 | | |
| 167 | 010010010000000 | 217 | 100010000010001 | | |
| 168 | 010010010000001 | 218 | 100010000010010 | | |
| 169 | 010010010000010 | 219 | 100010000100000 | | |
| 170 | 010010010000100 | 220 | 100010000100001 | | |
| 171 | 010010010001000 | 221 | 100010000100010 | | |
| 172 | 010010010001001 | 222 | 100010000100100 | | |
| 173 | 100000000000100 | 223 | 100010010000000 | | |
| 174 | 100000000001000 | 224 | 100010010000001 | | |
| 175 | 100000000001001 | 225 | 100010010000010 | | |
| 176 | 100000000010000 | 226 | 100010010000100 | | |
| 177 | 100000000010001 | 227 | 100010010001000 | | |
| 178 | 100000000010010 | 228 | 100010010001001 | | |
| 179 | 100000000100000 | 229 | 100100000000001 | | |
| 180 | 100000000100001 | 230 | 100100000000010 | | |
| 181 | 100000000100010 | 231 | 100100000000100 | | |
| 182 | 100000000100100 | 232 | 100100000001000 | | |
| 183 | 100000001000000 | 233 | 100100000001001 | | |
| 184 | 100000001000001 | 234 | 100100000010000 | | |
| 185 | 100000001000010 | 235 | 100100000010001 | | |
| 186 | 100000001000100 | 236 | 100100000010010 | | |
| 187 | 100000001001000 | 237 | 100100000100000 | | |
| 188 | 100000001001001 | 238 | 100100000100001 | | |
| 189 | 100000010000000 | 239 | 100100000100010 | | |
| 190 | 100000010000001 | 240 | 100100000100100 | | |
| 191 | 100000010000010 | 241 | 100100001000000 | | |
| 192 | 100000010000100 | 242 | 100100001000001 | | |
| 193 | 100000010001000 | 243 | 100100001000010 | | |
| 194 | 100000010001001 | 244 | 100100001000100 | | |
| 195 | 100000010010000 | 245 | 100100001001000 | | |
| 196 | 100000010010001 | 246 | 100100001001001 | | |
| 197 | 100000010010010 | 247 | 100100010000000 | | |
| 198 | 100000100000000 | 248 | 100100010000001 | | |
| 199 | 100000100000001 | 249 | 100100010000010 | | |

Fig.13 PRIOR ART

4-8 CONVERSION TABLE

| DATA WORD | CODE WORD |
|---|---|
| 0 0 0 0 (0) | 0 0 0 * 0 0 0 |
| 0 0 0 1 (1) | 0 0 0 * 0 0 1 |
| 0 0 1 0 (2) | 0 0 0 0 0 1 0 |
| 0 0 1 1 (3) | 1 0 0 1 0 0 1 |
| 0 1 0 0 (4) | 0 0 0 0 1 0 0 |
| 0 1 0 1 (5) | 0 0 1 0 0 1 0 |
| 0 1 1 0 (6) | 0 0 1 0 0 0 1 |
| 0 1 1 1 (7) | 0 0 1 0 0 0 0 |
| 1 0 0 0 (8) | 1 0 0 * 0 0 0 |
| 1 0 0 1 (9) | 1 0 0 0 0 0 1 |
| 1 0 1 0 (A) | 1 0 0 0 0 1 0 |
| 1 0 1 1 (B) | 0 1 0 0 1 0 0 |
| 1 1 0 0 (C) | 1 0 0 0 1 0 0 |
| 1 1 0 1 (D) | 0 1 0 0 0 1 0 |
| 1 1 1 0 (E) | 0 1 0 0 0 0 1 |
| 1 1 1 1 (F) | 0 1 0 0 0 0 0 |

SINGLE MERGING BIT DC-SUPPRESSED RUN LENGTH LIMITED CODING

TECHNICAL FIELD

The present invention relates to a data modulation method for binary data and an apparatus therefor, and relates particularly to a modulation method and apparatus for run-length limited coding used for recording to a recording medium.

BACKGROUND ART

To transmit a digital data stream, the digital data stream must be modulated to a signal suitable for transmission by the communications circuit or the transmission path (channel) of the recording apparatus.

Various modulation methods have also been proposed with the primary purpose being to achieve a high recording density in the recording and reproducing apparatuses. FIG. 10 is a block diagram of a typical modulation/demodulation apparatus whereby the data words input for recording to the recording medium are first converted to code words by a coding converter, the code word sequence is then modulated to a channel signal by an NRZI (non-return to zero-inverse) modulator, and the resulting channel signal is output to the write head of the recording/reproducing apparatus.

FIG. 11 shows an example of the modulated data stream. Note that the 4-bit input data word is converted to an 8-bit code word sequence, which is then modulated to an NRZI-modulated channel signal as shown.

Because of such considerations as the channel frequency characteristics and head tracking control, the inversion interval (the period for which a HIGH or LOW signal state continues) of the NRZI signal wave form is limited, and the DC component (the difference between accumulation of the HIGH signal state periods and that of LOW signal periods) must be low. This means that when converting the input data words to code words, the inversion interval of the obtained code words must be constantly maintained within a predetermined range. Because the inversion interval is thus limited in the code words, i.e., the run length of bits of the same bit value is limited, this type of code is known as "run-length limited" (RLL) code.

One measure expressing the attributes of an RLL code is the (d,k) constraint. The (d,k) constraint defines the run-length limits of the code word where constraint d is the minimum and constraint k is the maximum number of consecutive 0s permitted between two 1s. The (d,k) constraint must be satisfied both within individual code words and in the mergings between two or more consecutive code words.

To obtain a code word sequence satisfying these constraints, data encoders according to the prior art modulate the data according to a procedure such as that shown in the flow chart in FIG. 12 and described below.

First, each input data word is converted to the corresponding code word based on a predetermined conversion table (step S300)

If the (d,k) constraints are not satisfied in the code word conjunctions, $T_{min}$ and $T_{max}$ control are applied (steps S301 and S302). Note that $T_{min}$ control as used here refers to the process of rewriting part of the code word(s) to satisfy constraint d, and $T_{max}$ control refers to the process of rewriting part of the code word(s) to satisfy constraint k.

Parts of the code words may then be rewritten to minimize the DC component of the channel signal ("DC control" below) (step S303). Note that the DC component of the channel signal is the difference (called the digital sum value (DSV) below) between the total number of bits of value 1 and the total number of bits of value 0 in the whole signal. The DC component must be low for an optical recording/reproducing apparatus or magnetic recording/reproducing apparatus using integral detection to stably discriminate the 1s and 0s of the read signal.

This operation is described more specifically below using an input data stream.

It is assumed in this example that the 4-bit input data word is converted to 7-bit code words satisfying a (2,11) constraint rule, and consecutive data words are separated by a merging bit with a value of 1. The 8–15 conversion table shown in FIG. 13 is used for the particular conversion table referenced in step S300. Note that in FIG. 13 an asterisk (*) indicates bits of either value 0 or 1. Thus, the nineteen code words:

{0000000 0000001 0000010 0000100 0001000 0001000
0010000 0010001 0010010 0100000 0100001 0100010
0100100 1000000 1000001 1000010 1000100 1001000
1001001} satisfying this (2,11) constraint are used to code the sixteen data words shown with the code word pairs (0000000, 0001000), (0000001,0001001), and (100000,1001000) used selectively to code the data words 0000, 0001, and 1000, respectively. More specifically, the value of bits * in the code words corresponding to data words 0000, 0001, and 1000 in FIG. 13 is assumed to be 0 or 1. Suppose the data words 6, C, 7, and 0 (hexadecimal notation) are sequentially input as the input data, as an example. These data words are converted to a code word sequence of the four words 0010001 1000100 0010000 000*000 based on the conversion table in FIG. 13 (step S300). If these code words are then linked by inserting a 0 merging bit between the code words, the resulting bit sequence is:

0010001[0]1000100[0]0010000[0]000*000 and the bit sequence 1[0]1 where the first and second code words are joined violates constraint d of the (2,11) constraint rule being used. As a result, $T_{min}$ control is necessary.

The rule used for $T_{min}$ control is:

if (xxxxx001[0]100xxxx)→(xxxxx000[1]000xxxx), wherein X is either 0 or 1.

More specifically, if the resulting bit sequence of the code words is (xxxxx00I[0]100xxxx), then convert the bit sequence to (xxxxx000[1]000xxxx).

Thus, the bit sequence of the above code word sequence after $T_{min}$ control is

0010000[1]0000100[0]0010000[0]000*000

(step S301). While part of the first and second code words in this code word sequence is thus rewritten using a merging bit of 1, it is possible to restore this code word sequence to the original code word sequence, i.e., demodulate the code word sequence, because the merging bit is 1.

If the * bit (10000[0]000*000) in the fourth code word of the code word sequence after $T_{min}$ control is 0, constraint k of the (2,11) constraint rule will be violated. $T_{max}$ control is therefore applied to set the * bit to 1 (step S302). The bit sequence of the code word sequence after $T_{max}$ control is therefore

0010000[1]0000100[0]0010000[0]0001000

(step S302). While the second merging bit is 0 in the above sequence, it may have a value of 1 as a result of a particular coding situation. When it is then determined during demodulation that this merging bit was set to 1 by $T_{min}$ control, the demodulator attempts to change both adjacent bits to 1. The resulting sequence violates constraint k, however, and the merging bit can therefore be discriminated from being set to 1 by $T_{min}$ control. The bit sequence can therefore be correctly demodulated whether this second merging bit is 0 or 1. The NRZI-modulated channel bit sequences for a second merging bit of 0 and 1 are, respectively:

00111110000011111110000000001111, and

00111110000011100011111111110000.

Either sequence may therefore be selected and DC control enabled. If the * bit in the code word sequence can be set to 0 without violating constraint k, the value of this * bit can be chosen for optimum DC control (step S303).

The conventional data encoder thus described according to Japanese Patent tokkai S61-84124 (1986-84124) (corresponding to U.S. Pat. No. 4,728,929 to S. Tanaka issued Mar. 1, 1988) thus uses plural code words to code some of the data words in the input data word sequence based on a predefined conversion table, and selects the specific code words used to avoid violating constraint k.

In general, the minimum inversion interval of the channel signal is preferably set as long as possible as a means of increasing the recording density or the transmission capacity of a bandwidth-limited transmission path. In addition, the maximum inversion interval of the channel signal is preferably set as short as possible as a means of stabilizing the clock used to regulate transmission or reading the reproduced channel signal. To enable transmission or recording of the channel signal to a transmission path or recording/reproducing system with poor DC stability, it is also preferable to eliminate the need for DC reproduction by suppressing the DC component included as channel signal information.

The conventional method described above, however, uses a 1-bit merging bit inserted between 7-bit code words, thus producing a ⅛ redundant signal and an equivalent shortening of the minimum inversion interval of the channel signal. It is possible to convert 8-bit data words to 14-bit code words joined by a 1-bit merging bit to achieve the same constraint d as above. Redundancy in this case is 1/15, and the minimum inversion interval lengthens by an amount equivalent to the drop in redundancy. When $T_{max}$ control is applied as described above, however, the best constraint rule possible is (2, 17).

DISCLOSURE OF INVENTION

Therefore, an object of the present invention is to provide an efficient digital modulation/demodulation method, an apparatus therefor, and a recording medium recorded thereby, by reducing redundancy and effectively accomplishing $T_{max}$ control.

A second object of the present invention is to provide a digital modulation/demodulation method capable of suppressing the DC component of the channel signal, an apparatus therefor, and a recording medium recorded thereby.

A third object of the present invention is to provide a method and apparatus for reproducing a channel signal modulated by the digital modulation method of the present invention.

To achieve the above objects, an article of manufacture according to the present invention comprises: a reproducer usable medium having reproducer readable code word embodied therein, said reproducer readable code word in said article of manufacture comprising:

pits and pit-intervals between the pits, each pit having a length greater than d bits and less than k bits, and each pit-interval having a length greater than d bits and less than k bits, said pits and pit-intervals being determined by:

(a) dividing an original digital data into data words, each data word having a length of m bits;

(b) converting said data words to code words, each code word having a length of n bits, provided: that n is greater than m; and that when a code word comprises two bits of value 1, an alignment of consecutive bits of value 0 inserted between said two bits of value 1 has a length greater than d bits and less than k bits;

(c) connecting said code words with a one-bit merging bit inserted between said code words, said merging bit normally selected as having a bit value of 0;

(d) selecting said merging bit as having a bit value of 1 when:

(i) adjacent bits on both sides of the merging bit are 1s, and in this case, said adjacent bits are also changed to 0s;

(ii) when trailing P bits of a code word preceding the merging bit and leading Q bits of a code word following the merging bit are all 0s, provided that P+Q≧k, and in this case, at least either one of said P bits and Q bits has a bit sequence of (00000), and said bit sequence (00000) is changed to (00100); and (e) converting bit sequence of the connected code words to an NRZI bit sequence.

According to the present invention, digital modulation method for modulating an original digital data to an NRZI bit sequence, comprises the step of:

(a) dividing said original digital data into data words, each data word having a length of m bits;

(b) converting said data words to code words, each code word having a length of n bits, provided: that n is greater than m; and that when a code word comprises two bits of value 1, an alignment of consecutive bits of value 0 inserted between said two bits of value 1 has a length greater than d bits and less than k bits;

(c) connecting said code words with a one-bit merging bit inserted between said code words, said merging bit normally selected as having a bit value of 0;

(d) selecting said merging bit as having a bit value of 1 when:

(i) adjacent bits on both sides of the merging bit are 1s, and in this case, said adjacent bits are also changed to 0s;

(ii) when trailing P bits of a code word preceding the merging bit and leading Q bits of a code word following the merging bit are all 0s, provided that P+Q≧k, and in this case, at least either one of said P bits and Q bits has a bit sequence of (00000), and said bit sequence (00000) is changed to (00100); and (e) converting bit sequence of the connected code words to said NRZI bit sequence.

According to the present invention, a digital modulation apparatus for modulating an original digital data to an NRZI bit sequence, comprises:

converting means for converting the m bit long data words to code words, each code word having a length of n bits, provided: that n is greater than m; and that when a code word comprises two bits of value 1, an alignment of consecutive bits of value 0 inserted between said two bits of value 1 has a length greater than d bits and less than k bits;

connecting means for connecting said code words with a one-bit merging bit inserted between said code words, said merging bit normally selected as having a bit value of 0;

first selecting means for selecting said merging bit as having a bit value of 1 when adjacent bits on both sides of the merging bit are 1s, and in this case, said adjacent bits are also changed to 0s;

second selecting means for selecting said merging bit as having a bit value of 1 when trailing P bits of a code word preceding the merging bit and leading Q bits of a code word following the merging bit are all 0s, provided that P+Q≧k, and in this case, at least either one of said P bits and Q bits has a bit sequence of (00000), and said bit sequence (00000) is changed to (00100); and converting means for converting bit sequence of the connected code words to said NRZI bit sequence.

According to the present invention, a digital demodulation method for demodulating an NRZI bit sequence to an original digital data comprises the step of:

(a) demodulating said NRZI bit sequence to code bit sequence containing a plurality of code words with a merging bit inserted at each conjunction of the code words;

(b) detecting a merging bit;

(c) changing the adjacent bits on both sides of the merging bit to is when the merging bit is 1, and at the same time, three consecutive bits on both sides of the merging bit are 0s;

(d) changing the third bits on both sides of the merging bit to 0s when the following conditions (i), (ii) and (iii) are met:
   (i) the merging bit is 1,
   (ii) a third bit on one side of the merging bit is 1; and
   (iii) the other side of the merging bit has a pattern other than a predetermined bit pattern;

resulting in such that trailing P bits of a code word preceding the merging bit and leading Q bits of a code word following the merging bit are all 0s, provided that P+Q≧k, (e) separating code words to have a length of n bits; and (f) reconverting said code words to data words, each data word having a length of m bits.

According to the present invention, a digital demodulation apparatus for demodulating an NRZI bit sequence to an original digital data comprises:

demodulating means for demodulating said NRZI bit sequence to code bit sequence containing a plurality of code words with a merging bit inserted at each conjunction of the code words;

detecting means for detecting a merging bit;

changing means for changing the adjacent bits on both sides of the merging bit to 1s when the merging bit is 1, and at the same time, three consecutive bits on both sides of the merging bit are 0s;

changing means for changing third bits on both sides of the merging bit to 0s when the following conditions (i), (ii) and (iii) are met:
   (i) the merging bit is 1,
   (ii) the third bit on one side of the merging bit is 1; and
   (iii) other side of the merging bit has a pattern other than a predetermined bit pattern; resulting in such that trailing P bits of a code word preceding the merging bit and leading Q bits of a code word following the merging bit are all 0s, provided that P+Q≧k, separating means for separating code words to have a length of n bits; and reconverting means for reconverting said code words to data words, each data word having a length of m bits, provided that n is greater than m.

According to the preferred embodiment, the value of d is 2, the value of k is any one of 10, 11 and 12, the value of m is 8, the value of n is 14, and the value of each of P and Q is 8 or less.

Also, according to the preferred embodiment, the merging bit is selected as having a bit value of 1 further in a case (iii) when one side of the merging bit has a bit sequence of (00100) and the other side thereof has a predetermined bit sequence.

According to the preferred embodiment, the predetermined bit sequence is (00000).

In operation, if either constraint d or k is violated by inserting a merging bit (one-bit) between the code words representing the data words to be recorded, the merging bit and part of one or both code words adjacent to the merging bit are changed to eliminate any constraint violation.

The bit pattern resulting from changing part of the code word sequence by means of $T_{max}$ control eliminating constraint k violations is a bit pattern that will not appear as a result of $T_{min}$ control changing part of the code word sequence to eliminate constraint d violations. It is therefore possible to discriminate whether the code word sequence was changed to eliminate a constraint d violation or a constraint k violation.

According to a preferred embodiment, 8-bit data words are converted to 14-bit code words, constraint d is defined as 2, and constraint k as 11. The DC component of the channel signal can be further suppressed.

Any changes made to the code word sequence for the purpose of DC component control can be easily discriminated from changes made to the code word sequence for other purposes.

According to the digital demodulation method and the digital demodulation apparatus of the present invention, changes made in the channel signal generated for $T_{min}$ control, $T_{max}$ control, or DC component control can be easily discriminated from each other, and code words to which such changes are made can be reliably restored to the original code words before said changes were made.

The code words can therefore also be reliably restored to the original data words.

The present application is based upon Japanese Patent Application No. 7-89728, which was filed on Apr. 14, 1995, the entire content of which is expressly incorporated by reference herein.

BRIEF DESCRIPTION OF DRAWINGS

The present invention will become more fully understood from the detailed description given below and the accompanying diagrams wherein:

FIGS. 2 and 3 are tables showing an example of the conversion table in the first embodiment for converting data words to code words;

FIG. 13 is an 4–8 data conversion table used by a prior art data modulation apparatus to convert data words to code words.

DETAILED DESCRIPTION OF THE PREFERRED EMBODIMENTS

The preferred embodiments of the present invention are described in detail below with reference to the accompanying figures. Note that the digital modulation apparatus described below specifically interprets the input data bit stream as a sequence of 8-bit data words, converts each 8-bit data word to a 14-bit code word, connecting the adjacent code words with a 1-bit merging bit between them to generate a serial sequence of plural code words, and then applies NRZI modulation to the resulting code word sequence for recording.

(Embodiment 1)

Figure 1:
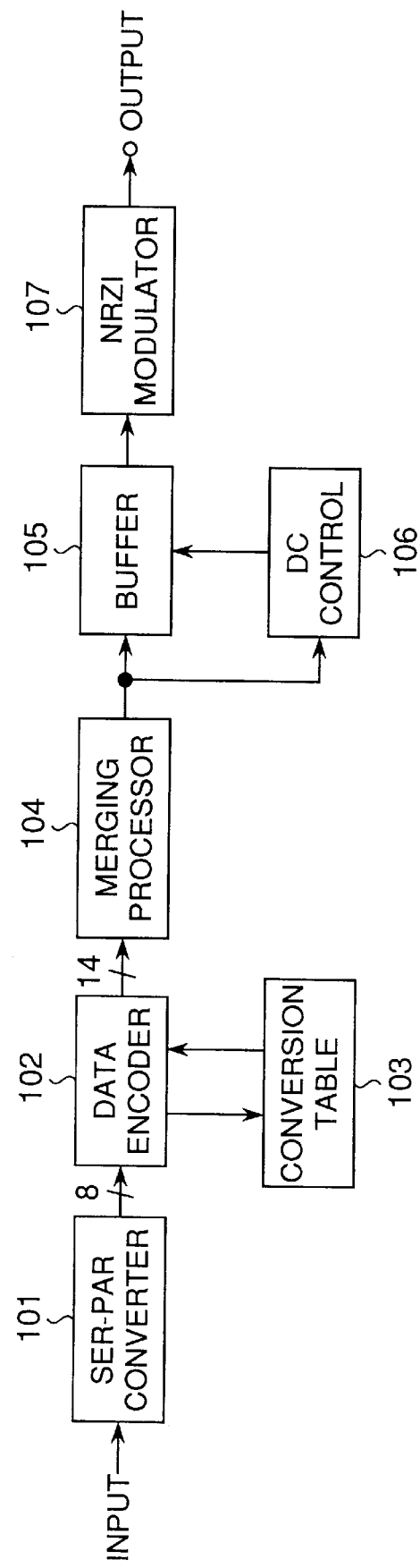
FIG. 1 is a block diagram of a digital modulation apparatus according to the first embodiment of the present invention.

FIG. 1 is a block diagram of a digital modulation apparatus according to the first embodiment of the present invention.

Figure 7:
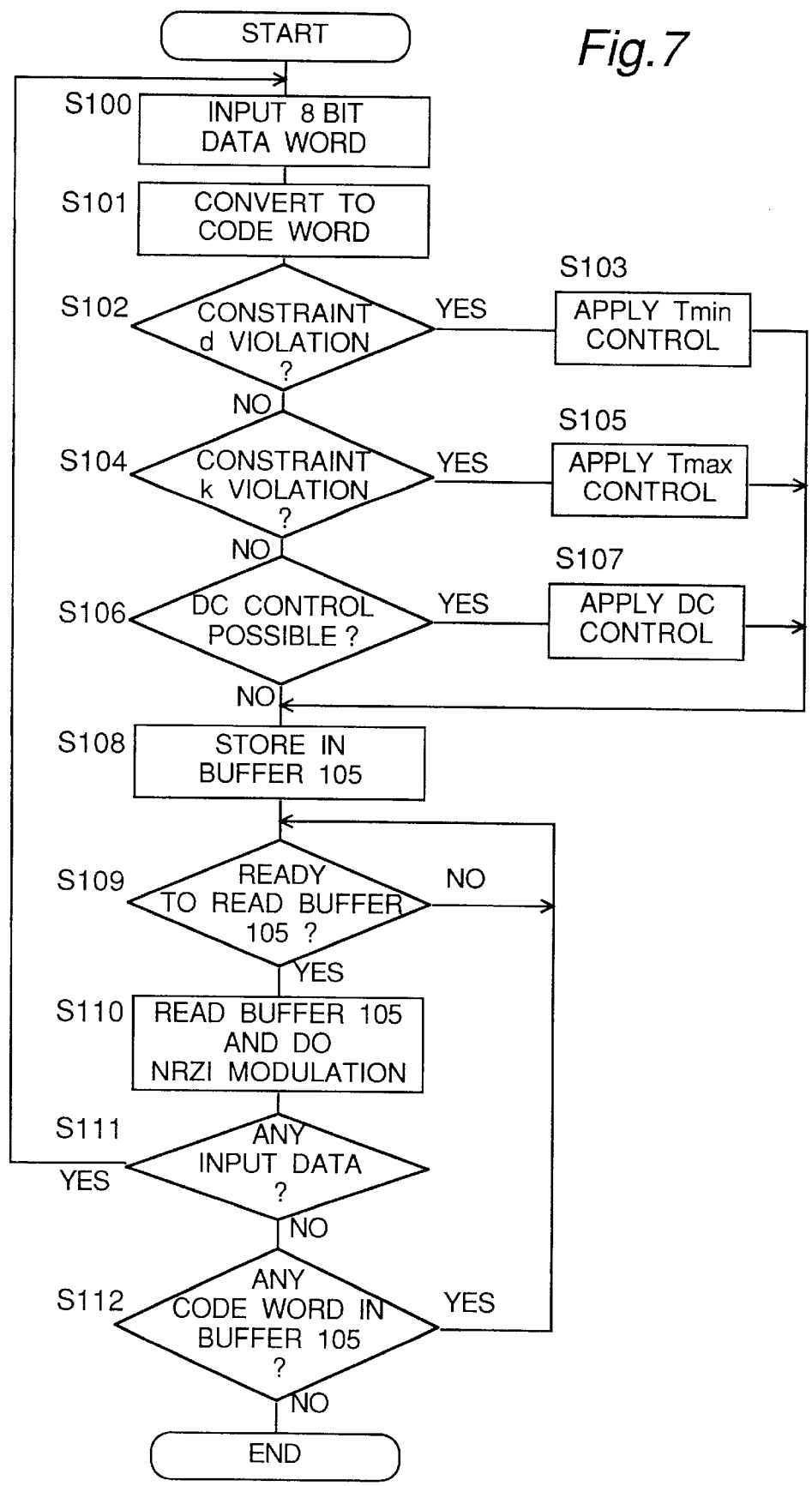
FIG. 7 is a flow chart used to describe the operation of a digital modulation apparatus according to the first embodiment of the invention.

As shown in FIG. 1, the digital modulation apparatus comprises a serial-parallel converter 101, data encoder 102, conversion table 103, merging processor 104, buffer memory 105, DC controller 106, and NRZI modulator 107. The operation of the digital modulation apparatus thus comprised is described below with reference to the flow chart shown in FIG. 7.

The serial-parallel converter 101 converts and outputs the input serial data bit stream to a parallel sequence of 8-bit data words (step S100). This serial-parallel converter 101 comprises a serial-input, parallel-output shift register. When the data encoder 102 receives the 8-bit data words output from the serial-parallel converter 101, data encoder 102 accesses the conversion table 103, which is preferably a semiconductor ROM, using the data words as the table address. The data encoder 102 thus extracts the 14-bit code word stored at the data word address in the conversion table 103 (step S101).

FIGS. 2 and 3 are an example of the conversion table stored as the conversion table 103.

The merging processor 104 connects the code words output from the data encoder 102 with a 1-bit merging bit between them to generate a serial code word sequence while processing the code word conjunctions to maintain the run length within the defined constraints. This merging bit is normally a 0. However, if insertion of a 0 merging bit results in a bit stream violating either constraint d or constraint k, the merging bit value is changed to 1, and specific bit values in the channel signal are changed according to specific rules so that constraints d and k are not violated.

Here, constraint d is the minimum number of consecutive 0s permitted between two 1s, and according to the present exemplification d=2. Thus, when the number of 0s provided between two 1s is less than d, the constraint d is violated. Since d=2 in the above exemplification, one 0 provided between two is, i.e., 101 bit pattern, is the only case that violates the constraint d. When the violation of constraint d is detected, the $T_{min}$ control is effected to clear the constraint d violation.

Similarly, constraint k is the maximum number of consecutive 0s permitted between two 1s, and according to the present exemplification k=11. Thus, when the number of 0s provided between two 1s is greater than k, constraint d is violated. For example, when there are twelve consecutive 0s provided between two 1s, the constraint k is violated. When the violation of constraint k is detected, the $T_{max}$ control is effected to clear the constraint k violation.

The operations executed by this merging processor 104 for $T_{min}$ control and $T_{max}$ control are shown below and described with reference to FIGS. 4 and 5, respectively.

($T_{min}$ control)

(1) Changes x001[0]100x to x000[1]000x. ($T_{max}$ control)

(2) Changes 1000[0]00000000x to 1000[1]00100000x.

(3) Changes 10000[0]0000000x to 10000[1]0010000x.

(4) Changes x00000[0]000000x to x00100[1]001000x.

(5) Changes x000000[0]00000x to x0001100[1]00100x.

(6) Changes x0000000[0]00001 to x0000100[1]00001.

(7) Changes x00000000[0]0001 to x00000100[1]0001.

where values in square brackets [] represent the merging bit values, and x is either 0 or 1. The bits on the left hand side of the merging bit belong to the preceding code word, and bits on the right hand side of the same belong to the following code word.

First, the $T_{min}$ control process is described below with reference to the code sample shown in FIG. 4. It is assumed in the example shown in FIG. 4 that data word 0 (decimal) is followed by data word 255 (decimal) with a 0 merging bit inserted between the corresponding code words. In other words, the code word for the data word 0 is the preceding code word, and the code word for the data word 255 is the following code word. A resulting bit sequence is shown below.

00000000100001[0]10010010010010

In this case a pattern 101 appears with the center 0 being the merging bit. This pattern 101 violates the constraint d, because the number of 0s between two 1s is one which is less than two, i.e., less than the number of minimum consecutive 0s permitted between two is (d=2). To avoid the violation of constraint d, the $T_{min}$ control is effected in a manner shown in the above case (1). Thus, the above bit sequence is changed to:

00000000100000[1]00010010010010.

To detect the violation of constraint d, a detector (logic gates 202, 203, 204, 205 in FIG. 6) is provided for detecting the pattern 101 with the center 0 being the merging bit.

Figure 6:
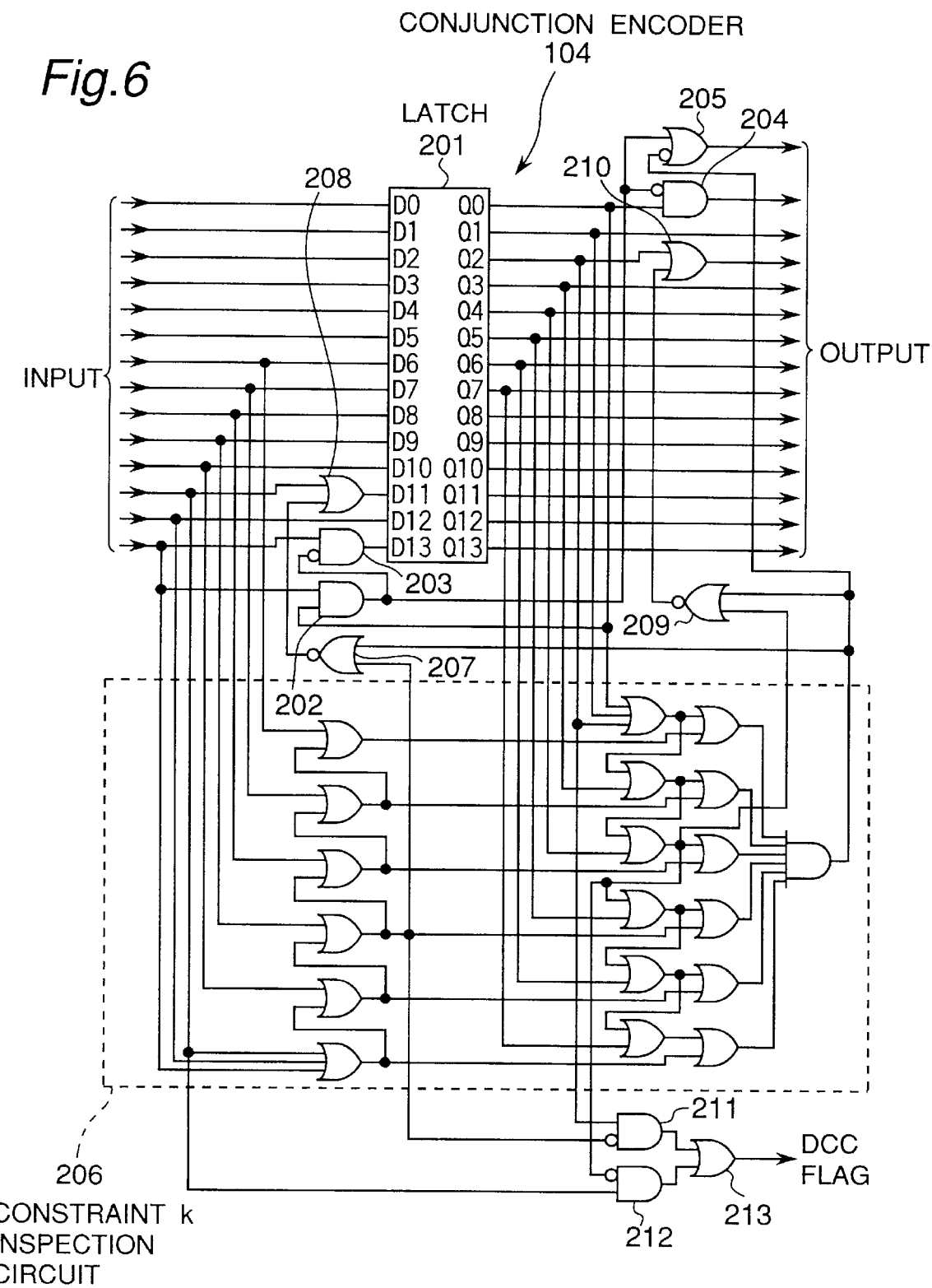
FIG. 6 is a circuit diagram of the merging processor shown in FIG. 1.

Thus in operation, it is checked whether or not any 101 bit patterns in the output code word sequence is present, i.e., any violence of constraint d in the code: word sequence is present (step S102). If the 101 bit pattern is detected with the junction bit 0 being at the center, $T_{min}$ control is applied to convert the 101 bit pattern to a 010 bit pattern (step S103). In the circuit of FIG. 6, the detector defined by logic gates 202, 203, 204 and 205 serves also as a converter for converting the 101 bit pattern to 010 bit pattern. As shown at the bottom of FIG. 4, pits and pit intervals are shown which occur alternatively in response to the occurrence of 1s in the code words bits. Thus, in accordance with the code word bits, pits and pit intervals are formed on the optical disk. It is noted that the pits can be indents, or can be markings formed on the disk surface where physical characteristics, such as reflectance, is varied.

Next, the $T_{max}$ control process of the present embodiment is described with reference to FIG. 5. In this example the code words for the decimal data words 100 and 0 (code word for the data word 100 is the preceding code word, and that for the data word 0 is the following code word) are again separated by a 0 merging bit, resulting in the bit sequence:

00100100010000[0]00000000100001 containing a run of thirteen 0 bits including the merging bit. This situation corresponds to $T_{max}$ control case (3) shown above, so that after the $T_{max}$ control is applied, the merging bit and the third bit following the merging bit are changed to 1. This results in a shorter run of 0 bits.

According to the exemplification of the code words shown in FIGS. 2 and 3, $T_{max}$ control is applied for six possible cases which are shown as cases (2)–(7) above. Such six possible cases are the cases in which, after inserting the merging bit 0, the run length of 0 bits results in twelve or greater. The coding process executed by the merging processor 104 thus determines whether $T_{max}$ control is necessary, i.e., detects the constraint k violation, by checking, if the merging bit 0 is inserted, whether or not any sequence of 0 bits has a run length of twelve bits or longer (step S104).

As apparent from the six cases (2)–(7) shown above, the constraint k violation occurs when the trailing P bits of the preceding code word and the leading Q bits of the following code word are all 0s, provided that $P+Q \geq k$. In the above exemplification, k=11. Also, according to the example of the code words shown in FIGS. 2 and 3, the maximum leading or trailing consecutive 0s is 8, so that P or Q may not be greater than 8. Thus, the cases in which the constraint k violation occurs are when (P, Q)=any one of {(3, 8), (4, 7–8), (5, 6–8), (6, 5–8), (7, 4–8), (8, 3–8)}

When the constraint k violation is detected, $T_{max}$ control is effected in such a manner that (i) the merging bit is changed from 0 to 1, and that (ii) the third bit counted from the merging bit is changed from 0 to 1 for the consecutive 0s whose number is greater than four counted from the merging bit (step S105).

Figure 5:
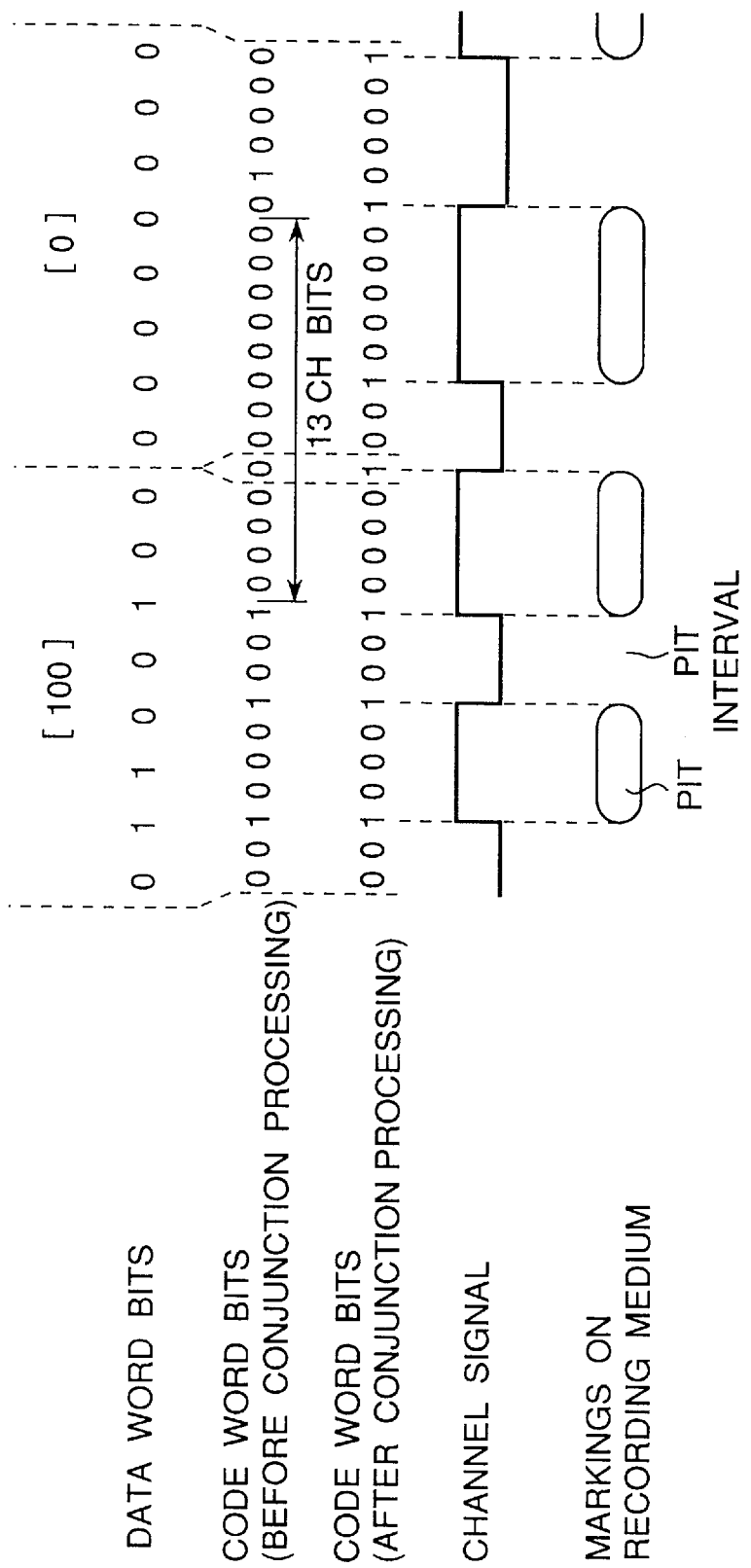
FIG. 5 is a conceptual illustration of the $T_{max}$ control operation of the first embodiment, and the marks and spaces formed on the recording medium as a result of $T_{max}$ control.

Thus, according to the example shown in FIG. 5, the $T_{max}$ control is applied such that the merging bit is converted to 1, and the 00000 bit sequence following the merging bit is converted to a 00100 bit sequence.

After applying $T_{max}$ control in this way, the run length of 0s is reduced so as not to be longer than eleven. The maximum run length of 0s will be eleven. Such a maximum (11) run length of 0s occurs, for example, when the preceding code word ends with . . . 100 and the following code word starts with 00000000. . . , or when the preceding code word ends with . . . 1 and the following code word starts with 100000000001. . . $T_{max}$ control is not applied in the former case, resulting in an 11-bit run of 0s including the merging bit. $T_{min}$ control is applied in the latter case, resulting in an 11-bit run of 0s contained within the second code word. In both cases, the run length is eleven, and the (d, k) constraints of the present embodiment are not violated.

The code words thus processed by the merging processor 104 are then stored to the buffer memory 105 and output to the DC controller 106. The DC control is possible when the following two conditions are satisfied:

(a) It is possible to choose either 0 or 1 for the merging bit, and yet not violating the (d, k) constraints, that is a case other than the above listed cases (1)–(7); and (b) It is possible to discriminated between the case when the merging bit is set to 1 as a result of $T_{min}$ control or $T_{max}$ control, and the case when the merging bit is set to 1 as a result of DC control.

When the above two conditions (a) and (b) are satisfied, it is possible to applied the DC control to minimize the DC component of the channel signal (step S106).

When DC control is thus possible, the DC controller 106 determines whether any bit sequences to which DC control can be applied and for which the merging bit value is still not determined are stored in the buffer memory 105. If there are, the DC controller 106 sets the value of the merging bit in the previously buffered bit sequence to minimize the absolute value of the DSV accumulated to immediately before the new bit sequence in which DC control is possible (step S107). The new bit sequence in which DC control is possible is then stored to the buffer memory 105 without fixing the value of the merging bit (step S108).

According to the present invention, the DC control is possible in the following two cases (8) and (9). (DC control)

(8) If . . . 00100[0]00000 . . . , [0] can be changed to [1].
(9) If . . . 00000[0]00100 . . . , [0] can be changed to [1].

The above two conditions (8) and (9) for effecting the DC control can be revised as follows:

(a) Either the third bit before or the third bit after the merging bit is 1; and (b) A bit sequence of 00000 is present immediately before or after the merging bit.

In the case where the $T_{min}$ control is applied, the above condition (a) is not satisfied. In the case where $T_{max}$ control is applied, condition (b) is not satisfied, because the bit sequence of 00000 will not appear immediately before or after the merging bit. Thus, upon detecting conditions (a) and (b), it is possible to apply the DC control.

The detail of the DC control is disclosed in U.S. Pat. No. 4,728,929 to S. Tanaka issued Mar. 11, 1988, which is herein incorporated by reference.

The NRZI modulator 107 then reads the code words for which all values have been determined from the buffer memory 105 (step S109), applies NRZI modulation, and outputs the modulated sequence (step S110).

The process described above is repeated for as long as there is input data to process (step S111). If when data input stops a bit sequence for which any bit values have not been determined remains in the buffer memory 105, the remaining bit values are determined with reference to the DSV value at that point. All remaining code words in the buffer memory 105 are then read, NRZI modulated, and output (step S112)

Figure 4:
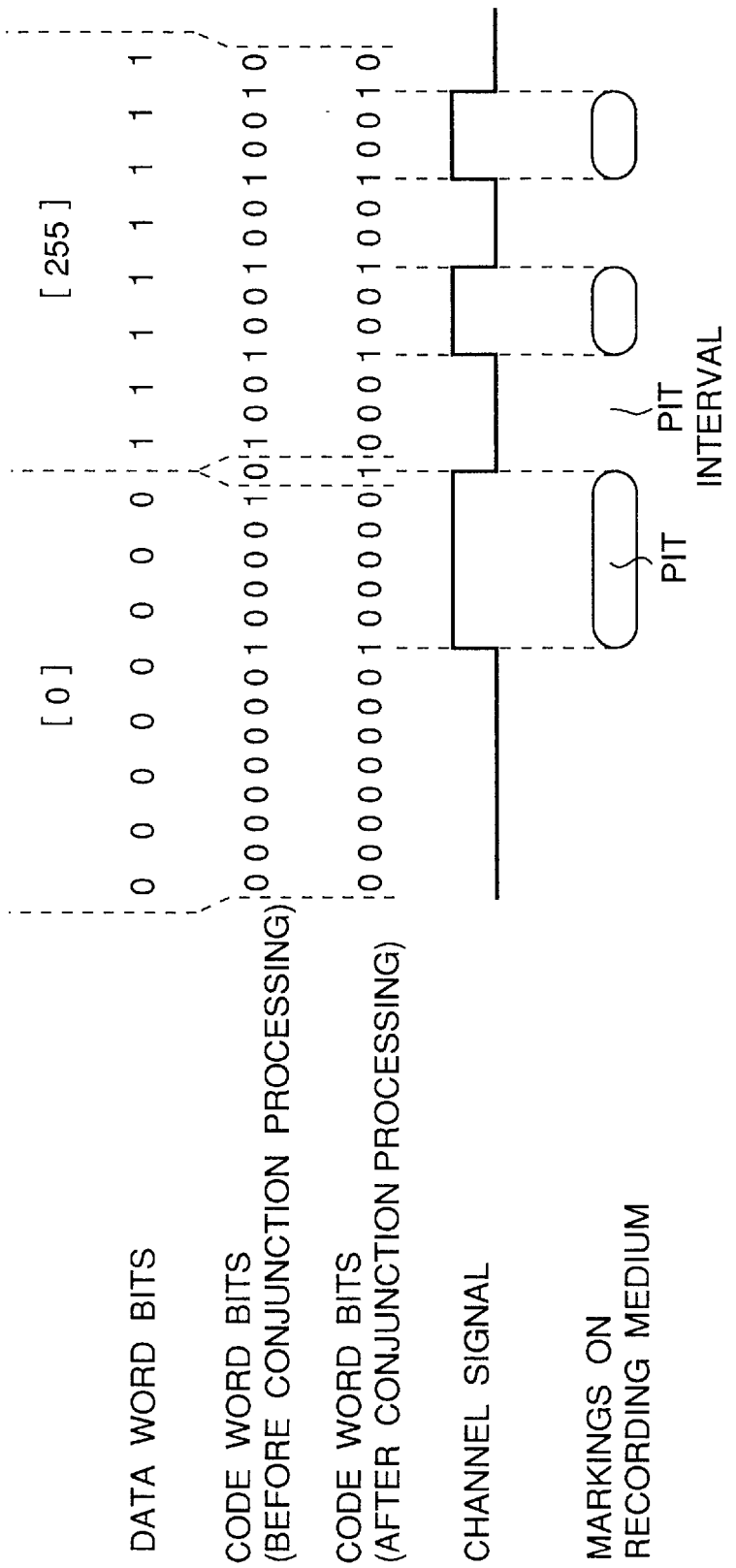
FIG. 4 is a conceptual illustration of the $T_{min}$ control operation of the first embodiment, and the marks and spaces formed on the recording medium as a result of $T_{min}$ control.

The wave form of the channel signal obtained by the NRZI modulation operation of the NRZI modulator 107 is as shown in FIGS. 4 and 5, resulting in the recording marks shown in the same figures when the channel signals are recorded to, for example, an optical recording medium, such as an optical disk.

FIG. 6 is a circuit diagram of the merging processor 104. The merging processor 104 normally adds a merging bit 0, but when the above described case (1) is detected, the $T_{min}$ control is effected, and when any one of the above described cases (2)–(7) is detected, the $T_{max}$ control is effected. The 14-bit code word output from the data encoder 102 is applied at the rate of word clock to the input terminals D0–13 of the latch 201, which latches the input bits. The word clock is obtained by 1/15 frequency dividing a channel bit clock having a period of one channel signal bit. When the code word is then serially output, the bits are output sequentially from bit D13 to D0. The previously latched code word is output to the output terminals of the latch 201.

The AND gate 202 outputs the logical product of the last bit in one code word and the first bit in the following code word. When the LSB (Q0) of the previously latched code word and the MSB (D13) of the newly added code word are both HIGH, the AND gate 202 outputs HIGH ("1" below), indicating that $T_{min}$ control is required. As a result, the OR gate 205 changes the merging bit to 1, and AND gates 203 and 204 change the adjacent bit on each side of the merging bit to 0.

Using a combinational circuit of OR and AND gates, the constraint k inspection circuit 206 sets the output of the AND gates to LOW ("0" below) when the merging bit is 0 and there is a run including the merging bit of twelve or more 0s. A 0 output from the AND gate of the constraint k inspection circuit 206 thus indicates that $T_{max}$ control is required, and the OR gate 205 sets the merging bit to 1. When $T_{max}$ control is required and the following code word starts with 00000, the NOR gate 207 outputs 1, and the OR gate changes the beginning of the following code word to 00100. If $T_{max}$ control is required and the preceding code word ends with 00000, the NOR gate 209 outputs 1, and the OR gate 210 changes the end of the first code word to 00100.

AND gates 211 and 212 and OR gate 213 together form a combinational circuit for checking whether DC control is possible. If the output from the OR gate 213 is 1, DC control can be used. The DC controller 106 thus determines whether DC control is to be applied by checking the output bit of the OR gate 213.

By thus joining code words with a 1-bit merging bit and applying $T_{min}$ control, a d constraint of 2 is achieved. By applying $T_{max}$ control also using the merging bit, bit patterns that will not appear as a result of $T_{min}$ control are achieved, and constraint k can be held to a small value. It is therefore possible to use low redundancy code words which can be recorded to the recording medium using physically long marks and spaces as shown in FIGS. 4 and 5, and can be easily reproduced from said recording medium.

It is also possible to accomplish channel code DC control because the bit sequences resulting from $T_{min}$ control and $T_{max}$ control can be identified whether the merging bit is 0 or 1. A digital modulation method capable of minimizing the DC component is also desirable as a means of stabilizing tracking and focusing control and avoiding the effects of DC instability in an optical recording medium, and the digital modulation method according to the present invention is therefore well suited to use with optical recording media.

The present invention is particularly suitable to use with such optical recording media because it uses 8-bit data words and 14-bit code words which are relatively long code words. The redundancy-reducing effect of the present invention is further amplified by using a large number of word bits, but many digital processing systems are based on processing in byte units. The number of bits per data word is therefore preferably some multiple or divisor of eight bits, but if 16-bit data words are used, the circuit scale becomes unmanageably large and impractical. Therefore, eight bits per data word is the optimum number of bits per data word achieving the maximum benefit from the present invention.
(Embodiment 2)

Figure 8:
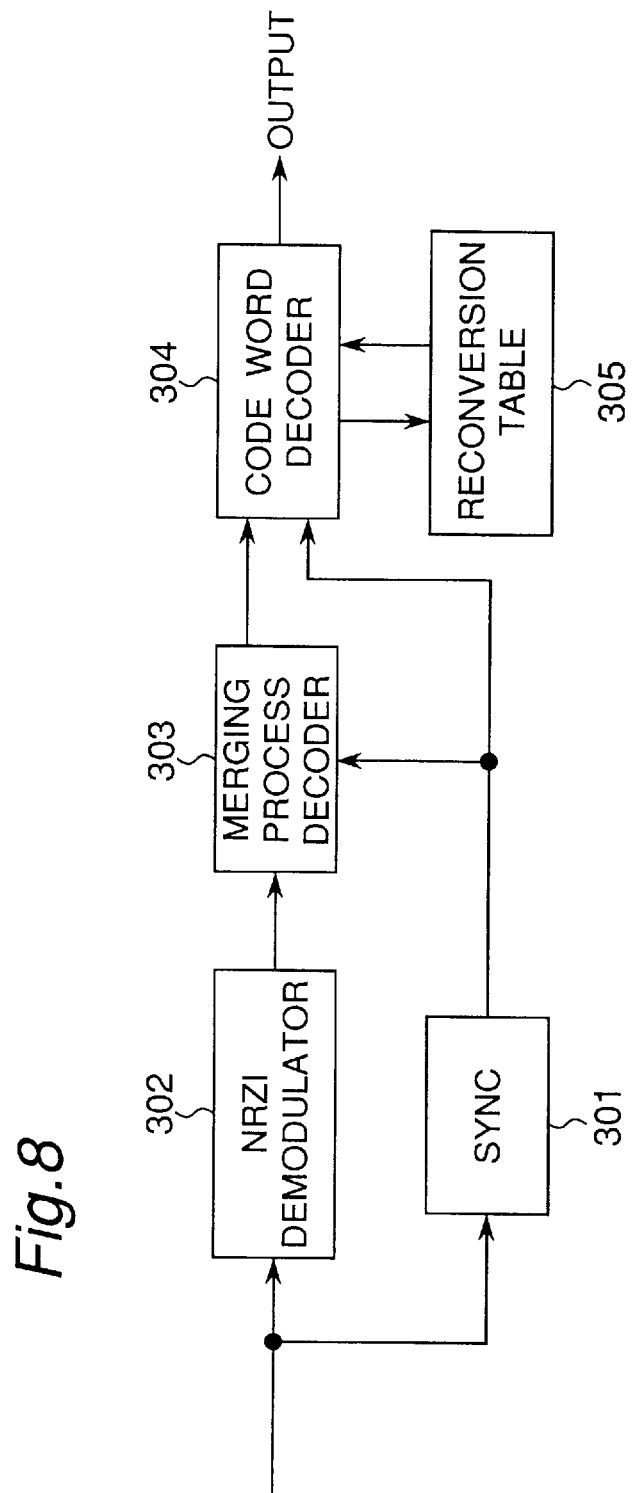
FIG. 8 is a block diagram of a digital demodulation apparatus according to the present invention.

FIG. 8 is a block diagram of a digital demodulation apparatus according to the present invention.

Figure 9:
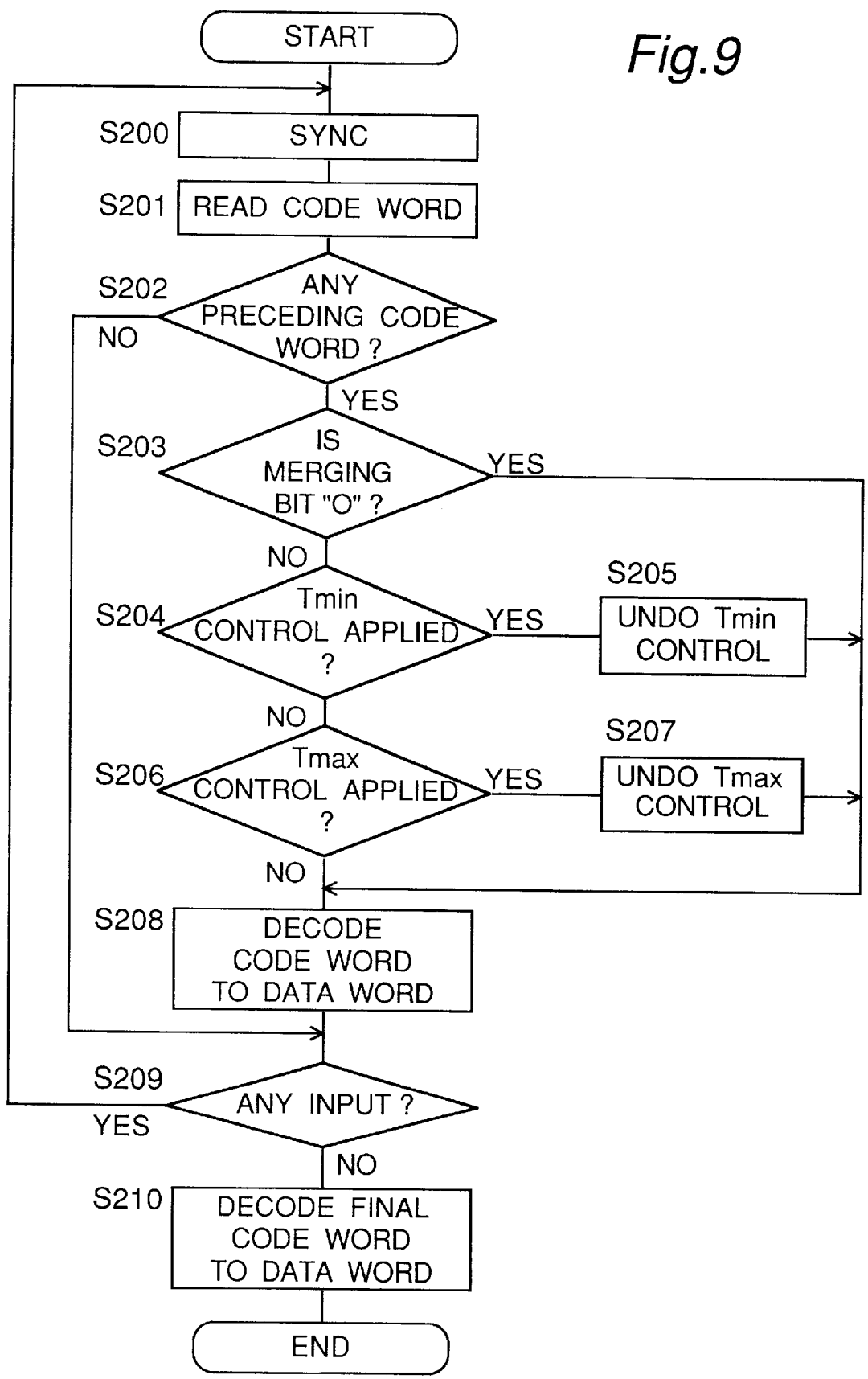
FIG. 9 is a flow chart used to describe the operation of a digital demodulation method according to the present invention.
Figures 10, 11:
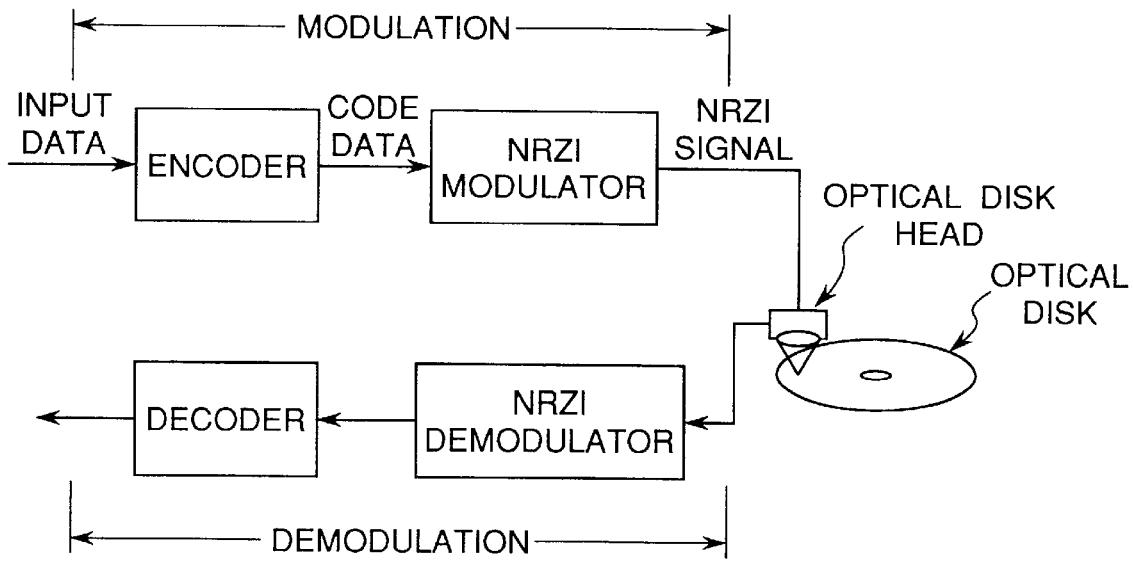
FIG. 10 is a block diagram of a typical modulation/demodulation apparatus according to a prior art.
FIG. 11 is a signal diagram used to illustrate the operation of a prior art digital modulation apparatus.
Figure 12:
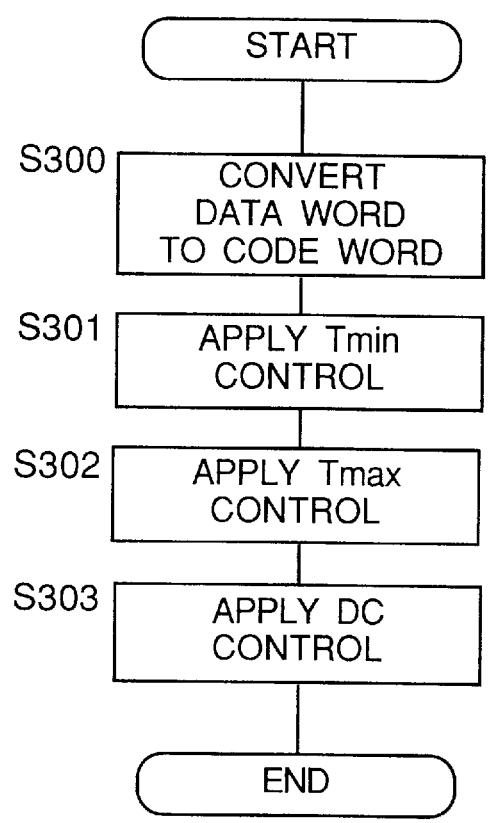
FIG. 12 is a flow chart used to describe the operation of a prior art data modulation apparatus.

As shown in FIG. 8, this digital demodulation apparatus comprises a synchronizer 301, an NRZI demodulator 302, a merging process decoder 303, a code word decoder 304, and a reverse-conversion (reconversion) table 305. The operation of this digital demodulation apparatus is described below with reference to the flow chart in FIG. 9.

When a channel signal is input from an external supply, the synchronizer 301 generates a channel bit clock by synchronizing a PLL to the input signal or another common clocking means. The synchronizer 301 then 1/15th frequency divides the channel bit clock to generate a word clock, and detects the synchronization signal contained in the input channel signal to adjust the word clock phase and synchronize to the code word edge. Synchronization is completed when word clock synchronization is completed (step S200).

The NRZI demodulator 302 then NRZI demodulates the NRZI-modulated channel signal to reproduce the code bit sequence containing a plurality of code words with a merging bit inserted between the code words, and outputs to the merging process decoder 303 (step S201).

When a 1-word code word is input, the merging process decoder 303 checks for the presence of a previously input code word (step S202). If the input code word is the first code word in the bit stream, and there is therefore no previously input code word buffered, the merging process decoder 303 stores the input code word to a temporary buffer.

If a code word was previously buffered, however, the merging process decoder 303 detects the value of the merging bit between the buffered (first) code word and the code word just input (step S203).

If the merging bit is 0, the first code word is output directly to the code word decoder 304. If the merging bit is 1, the merging process decoder 303 determines whether both the third bit before and the third bit after the merging bit are 0 (step S204). If both of these bits are 0, the adjacent bit on each side of the merging bit is changed to 1, and the bit sequence is then output to the code word decoder 304 (step S205). If either the third bit before or the third bit after the merging bit is 1 (step S204), it is determined whether the bit sequence 00000 is adjacent to the merging bit (step S206).

If the 00000 bit sequence is not adjacent, $T_{max}$ control is determined to have been applied, any 1 bit third from the merging bit is changed to 0, and the resulting bit sequence is output to the code word decoder 304 (step S207). If the merging bit is 1, either the third bit before or the third bit after the merging bit is 1, and the bit sequence 00000 is found adjacent to the merging bit, it is known that the merging bit is 1 because of DC control. In this case the code word has not been changed, and the first code word is therefore output to the code word decoder 304. Thus, at the merging process decoder 303, the merging bit is eliminated and the 14-bit long code words are sequentially applied to the code word decoder 304.

The code word decoder 304 first compresses the input 14-bit code word to ten bits. Specifically, if a fourteen bit sequence is divided into 3-bit segments, there are only four possible 3-bit patterns that may occur, i.e., 000, 001, 010, and 100, because of the (d,k) constraint of the code words, and only two bits are needed to specify the patterns. Therefore, when each 14-bit code word is divided into four 3-bit segments and one 2-bit segment, each 3-bit segment can be compressed to two bits, and the 14-bit code word can therefore be compressed to ten bits. These ten bits are then used to address the reverse conversion table 305, which is a semiconductor ROM, and read therefrom the data words reconverted from the code words (step S208). After reconverting a code word to the original data word, the demodulator looks for the next code word input (step S209). If there is no new input, the code word decoder 304 finishes restoring the last code word in the merging process decoder 303 (step S210). If another code word is input, the procedure from step S201 to S209 is repeated.

By thus detecting the value of the merging bit and the bit patterns adjacent thereto, it is possible to determine in a code word to which $T_{min}$ and $T_{max}$ control were applied using the merging bit whether the merging bit was changed to a 1 by $T_{min}$ or $T_{max}$ control, and it is therefore possible to reliably decode the changes to the channel code as a result of these control processes. When DC control is applied using the merging bit, it is also possible to discriminate bit sequences resulting from DC control from bit sequences resulting from $T_{min}$ or $T_{max}$ control, and the code words can be reliably decoded.

According to the present invention as described above, it is possible to provide a digital modulation method and apparatus therefor whereby redundancy resulting from the merging bit can be reduced and the maximum run length can be suppressed, thus increasing the minimum inversion interval while suppressing the maximum inversion interval of the channel signal. This is achieved specifically in digital modulation using a constraint d=2 with code words separated by a 1-bit merging bit by changing any 101 bit pattern centered on the merging bit to a 010 bit pattern resulting in at least three consecutive 0 bits adjacent to both sides of the merging bit, and further changing the merging bit to 1 and any 00000 bit sequence adjacent to the merging bit to a 00100 bit sequence if the number of consecutive 0 bits resulting from the preceding conversion of the code word conjunction exceeds the maximum run length of 0s permitted. By further using this digital modulation method and apparatus for recording, it is also possible to provide a recording medium in which the minimum length of the formed marks and spaces is long while the maximum length thereof is as short as possible.

By specifically defining the data word length as eight bits and the code word length as fourteen bits, the present invention can provide a digital modulation method and apparatus therefor whereby redundancy can be effectively reduced and the minimum inversion interval can be increased using circuitry of a practical scale, and a recording medium wherein the minimum length of the marks and spaces formed for recording can be effectively lengthened.

Also, according to the present invention as described above, it is possible to provide a digital modulation method and apparatus therefor whereby the DC component of the channel signal can be further suppressed because the code word sequence is generated by setting the merging bit to either value when the value of the third bit before the merging bit is 1 and the bit pattern following the merging bit satisfies particular conditions, or the value of the third bit following the merging bit is 1 and the bit pattern before the merging bit satisfies particular conditions. The recording medium achieved by the present invention is also recorded with an even ratio of recording marks and spaces, and reading is therefore simple.

Further, according to the present invention as described above, it is possible to provide a digital modulation method and apparatus therefor whereby the minimum and maximum inversion intervals of the channel signal are not affected by DC control of the channel signal because the merging bit is selectively set only when a 00000 bit sequence is adjacent to the merging bit. The recording medium achieved by the invention is also recorded with an even ratio of recording marks and spaces while enabling the code words changed by $T_{min}$ or $T_{max}$ control to be easily decoded during reproduction.

Also, according to the present invention as described above, it is possible to provide a digital demodulation method and apparatus therefor whereby code words changed by $T_{min}$ or $T_{max}$ control can be easily demodulated and decoded by means of a simple configuration inspecting only the merging bit value and the bit patterns adjacent thereto.

Still further, according to the present invention as described above, it is possible to provide a digital demodulation method and apparatus therefor whereby code words changed by $T_{min}$ or $T_{max}$ control in a channel signal to which $T_{min}$ and $T_{max}$ control are applied effectively can be easily demodulated and decoded by means of circuitry of a practical scale without being affected by DC control because the data words are eight bits long, the code words are fourteen bits long, and DC control is only applied when a 00000 bit pattern is detected adjacent to the merging bit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An article of manufacture, comprising:

a reproducer usable medium having a reproducer readable code word embodied therein, the reproducer readable code word in the article of manufacture comprising:

pits and pit-intervals between the pits, each pit having a length greater than 2 bits and equal to $T_{max}$ bits or less, each pit-interval having a length greater than 2 bits and equal to $T_{max}$ bits or less, the pits and pit-intervals being determined by:

(a) dividing an original digital data into data words, each data word having a length of m bits;

(b) converting the data words to code words, each code word having a length of n bits, provided that n is greater than m, and that when a code word comprises two bits of value 1, an alignment of consecutive bits 0 inserted between the two bits of value 1 has a length greater than 2 bits and equal to $T_{max}$ bits or less;

(c) connecting the code words with a one-bit merging bit inserted between the code words, the merging bit normally selected as having a bit value of 0;

(d) selecting the merging bit as having a bit value of 1 when:

(i) adjacent bits on both sides of the merging bit are 1s, and in this case, the adjacent bits are also changed to 0s; or (ii) when trailing P bits of a code word preceding the merging bit and leading Q bits of a code word following the merging bit are all 0s, provided that $P+Q \geq T_{max}$, and in this case, at least either one of the P bits and Q bits has a bit sequence of (00000), and in this bit sequence (00000) is changed to (00100); and (e) converting bit sequence of the connected code words to an NRZI bit sequence.

2. An article of manufacture according to claim 1, wherein the value of $T_{max}$ is any one of 11, 12 and 13, the value of m is 8, the value of n is 14, and the value of each of P and Q is 8 or less.

3. An article of manufacture according to claim 1, wherein said merging bit being selected as having a bit value of 1 further in a case (iii) when one side of the merging bit has a bit sequence of (00100) and the other side thereof has a predetermined bit sequence.

4. An article of manufacture according to claim 3, wherein said predetermined bit sequence is (00000).

5. A digital modulation method for modulating an original digital data to an NRZI bit sequence, the method comprising:

(a) dividing the original digital data into data words, each data word having a length of m bits;

(b) converting the data words to code words, each code word having a length of n bits, provided that n is greater than m, and that when a code word comprises two bits of value 1, an alignment of consecutive bits of value 0 inserted between the two bits of value 1 has a length in a range from 2 bits to k bits;

(c) connecting the code words with a one-bit merging bit inserted between the code words, the merging bit having a bit value of 0;

(d) selecting the merging bit as having a bit value of 1 when:
  (i) adjacent bits on both sides of the merging bit are 1s, and in this case, the adjacent bits are also changed to 0s; or
  (ii) when trailing P bits of a code word preceding the merging bit and leading Q bits of a code word following the merging bit are all 0s, provided that P+Q≧k, and in this case, at least either one of the P bits and Q bits has a bit sequence of (00000), and the bit sequence (00000) is changed to (00100); and (e) converting the bit sequence of the connected code words to the NRZI bit sequence.

6. A digital modulation method according to claim 5, wherein
  the value of k is any one of 10, 11 and 12,
  the value of m is 8,
  the value of n is 14, and
  the value of each of P and Q is 8 or less.

7. A digital modulation method according to claim 5, wherein said merging bit being selected as having a bit value of 1 further in a case (iii) when one side of the merging bit has a bit sequence of (00100) and the other side thereof has a predetermined bit sequence.

8. A digital modulation method according to claim 7, wherein said predetermined bit sequence is (00000).

9. A digital modulation apparatus for modulating an original digital data to an NRZI bit sequence, said original digital data being divided into data words, each data word having a length of m bits, said apparatus comprising:
  means for converting said data words to code words, each code word having a length of n bits, provided that n is greater than m, and that when a code word comprises two bits of value 1, an alignment of consecutive bits of value 0 inserted between said two bits of value 1 has a length in a range from 2 bits to k bits;
  means for connecting said code words with a one-bit merging bit inserted between said code words, said merging bit normally being selected as having a bit value of 0;
  first means for selecting said merging bit as having a bit value of 1 when adjacent bits on both sides of said merging bit are 1s, and in this case, said adjacent bits are also changed to 0s;
  second means for selecting said merging bit as having a bit value of 1 when trailing P bits of a code word preceding said merging bit and leading Q bits of a code word following said merging bit are all 0s, provided that P=Q≧k, and in this case, at least either one of said P bits and said Q bits has a bit sequence of (00000), and said bit sequence (00000) is changed to (00100); and
  means for converting said bit sequence of said connected code words to said NRZI bit sequence.

10. A digital modulation apparatus according to claim 9, wherein
  the value of k is any one of 10, 11 and 12,
  the value of m is 8,
  the value of n is 14, and
  the value of each of P and Q is 8 or less.

11. A digital modulation apparatus according to claim 9, further comprising third selecting means for selecting said merging bit as having a bit value of 1 when one side of the merging bit has a bit sequence of (00100) and the other side thereof has a predetermined bit sequence.

12. A digital modulation apparatus according to claim 11, wherein said predetermined bit sequence is (00000).

13. A digital demodulation method for demodulating an NRZI bit sequence to an original digital data, comprising:
  (a) demodulating said NRZI bit sequence to a code bit sequence containing a plurality of code words with a merging bit inserted between the code words;
  (b) detecting a merging bit;
  (c) changing adjacent bits on both sides of the merging bit to 1s when the merging bit is 1, and at the same time, three consecutive bits on both sides of the merging bit are 0s;
  (d) changing the third consecutive bits on both sides of the merging bit to 0s when the following conditions (i), (ii) and (iii) are met:
    (i) the merging bit is 1;
    (ii) a third bit on one side of the merging bit is 1; and
    (iii) an other side of the merging bit has a pattern other than a predetermined bit pattern,
  such that trailing P bits of a code word preceding the merging bit and leading Q bits of a code word following the merging bit are all 0s, provided that P+Q≧k,
  (e) separating code words, each code word having a length of n bits; and
  (f) reconverting said code words to data words, each data word having a length of m bits, provided that n is greater than m, and that when a code word comprises two bits of value 1, an alignment of consecutive bits of value 0 inserted between said two bits of value 1 has a length in a range from 2 bits to k bits.

14. A digital demodulation method according to claim 13, wherein said predetermined bit pattern is (00000).

15. A digital demodulation method according to claim 13, wherein
  the value of k is any one of 10, 11 and 12,
  the value of m is 8,
  the value of n is 14, and
  the value of each of P and Q is 8 or less.

16. A digital demodulation apparatus for demodulating an NRZI bit sequence to an original digital data, comprising:
  means for demodulating said NRZI bit sequence to a code bit sequence containing a plurality of code words with a merging bit inserted between every two adjacent code words;
  means for detecting said merging bit;
  first means for changing adjacent bits on both sides of said merging bit to 1s when said merging bit is 1, and at the same time, three consecutive bits on both sides of said merging bit are 0s;
  second means for changing said three consecutive bits on both sides of said merging bit to 0s when the following conditions (i), (ii) and (iii) are met:
    (i) said merging bit is 1;
    (ii) a third bit on one side of said merging bit is 1; and
    (iii) an other side of said merging bit has a pattern other than a predetermined bit pattern, such that trailing P bits of a code word preceding said merging bit and leading Q bits of a code word following said merging bit are all 0s, provided that $P+Q \geq k$, means for separating code words, each code word having a length of n bits; and means for reconverting said code words to data words, each data word having a length of m bits, provided that n is greater than m, and that when a code word comprises two bits of value 1, an alignment of consecutive bits of value 0 inserted between said two bits of value 1 has a length in a range from 2 to k bits.

17. A digital demodulation apparatus according to claim 16, wherein said predetermined bit pattern is (00000).

18. A digital demodulation apparatus according to claim 16, wherein the value of k is any one of 10, 11 and 12, the value of m is 8, the value of n is 14, and the value of each of P and Q is 8 or less.

* * * * *

UNITED STATES PATENT AND TRADEMARK OFFICE
CERTIFICATE OF CORRECTION

PATENT NO. : 5,774,078
DATED : June 30, 1998
INVENTOR(S) : S. TANAKA et al.

It is certified that error appears in the above-identified patent and that said Letters Patent is hereby corrected as shown below:

At column 14, line 29 (claim 1, line 15) of the printed patent, after "bits" (second occurrence) please insert ---of value---.

At column 15, line 59 (claim 9, line 23) of the printed patent, change "P=Q≥k" to ---P+Q≥k---.

Signed and Sealed this

Sixth Day of July, 1999

Attest:

Q. TODD DICKINSON

*Attesting Officer*  *Acting Commissioner of Patents and Trademarks*